(12) United States Patent
Yeom et al.

(10) Patent No.: US 12,464,775 B2
(45) Date of Patent: Nov. 4, 2025

(54) SEMICONDUCTOR DEVICE

(71) Applicant: SAMSUNG ELECTRONICS CO., LTD., Suwon-si (KR)

(72) Inventors: Donghyuk Yeom, Seoul (KR); Seonghwa Park, Seoul (KR); Kwanheum Lee, Suwon-si (KR); Sechan Lim, Boryeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 532 days.

(21) Appl. No.: 17/732,811

(22) Filed: Apr. 29, 2022

(65) Prior Publication Data

US 2023/0109987 A1 Apr. 13, 2023

(30) Foreign Application Priority Data

Oct. 12, 2021 (KR) .................. 10-2021-0134871

(51) Int. Cl.
*H10D 30/67* (2025.01)
*H10D 64/01* (2025.01)

(52) U.S. Cl.
CPC ..... *H10D 30/6735* (2025.01); *H10D 30/6713* (2025.01); *H10D 30/6757* (2025.01); *H10D 64/018* (2025.01)

(58) Field of Classification Search
CPC ......... H01L 29/42392; H01L 29/66553; H01L 29/78618; H01L 29/78696; H01L 21/823878; H10D 30/6735; H10D 86/215; H10D 64/018; H10D 62/364; H10D 84/0188; H10D 84/834; H10D 30/6713; H10D 30/6211
See application file for complete search history.

(56) References Cited

U.S. PATENT DOCUMENTS

| | | | |
|---|---|---|---|
| 9,881,998 B1 * | 1/2018 | Cheng | H01L 29/42392 |
| 10,050,107 B1 | 8/2018 | Cheng et al. | |
| 10,243,060 B2 | 3/2019 | Chao et al. | |
| 10,446,664 B1 | 10/2019 | Cheng et al. | |

(Continued)

FOREIGN PATENT DOCUMENTS

KR 1020190143209 A 12/2019

OTHER PUBLICATIONS

Dr. Ian Cutress, IBM Creates First 2nm Chip, on May 6, 2021 https://www.anandtech.com/show/16656/ibm-creates-first-2nm-chip.

*Primary Examiner* — Matthew C Landau
*Assistant Examiner* — Halee Cramer
(74) *Attorney, Agent, or Firm* — Muir Patent Law, PLLC

(57) ABSTRACT

A semiconductor device may include first and second active regions on a substrate, first and second insulating structures on the first and second active regions, respectively, vertically stacked channel layers on each of the first and second insulating structures, first and second gate structures intersecting the first and second active regions, respectively, and surrounding the channel layers, first and second source/drain regions doped with different conductivity-type impurities, the first and second source/drain regions being on sides of the first and second gate structures, respectively, and contacting the channel layers, and at least a portion of each of the first and second insulating structures extending upwardly along a side surface of a corresponding one of the first and second source/drain regions.

20 Claims, 13 Drawing Sheets

(56) References Cited

U.S. PATENT DOCUMENTS

| | | | |
|---|---|---|---|
| 10,818,792 B2 | 10/2020 | Frougier et al. | |
| 10,957,761 B2 | 3/2021 | Yeh et al. | |
| 2006/0125018 A1* | 6/2006 | Lee | H10D 84/0172 |
| | | | 257/369 |
| 2018/0166327 A1* | 6/2018 | Hsiao | H01L 21/28008 |
| 2018/0233557 A1* | 8/2018 | Cheng | H01L 29/401 |
| 2020/0052124 A1 | 2/2020 | Miao et al. | |
| 2020/0365687 A1* | 11/2020 | Xie | H01L 21/3065 |
| 2020/0381426 A1* | 12/2020 | Xu | H10D 30/014 |
| 2021/0193829 A1 | 6/2021 | Reznicek et al. | |
| 2021/0217654 A1* | 7/2021 | Xie | H10D 62/118 |
| 2021/0384310 A1* | 12/2021 | Yuan | H10D 30/6735 |

\* cited by examiner

SEMICONDUCTOR DEVICE

CROSS-REFERENCE TO RELATED APPLICATION

This application claims benefit of priority to Korean Patent Application No. 10-2021-0134871, filed on Oct. 12, 2021, in the Korean Intellectual Property Office, the disclosure of which is incorporated herein by reference in its entirety.

BACKGROUND

1. Field

The present disclosure relates to a semiconductor device.

2. Description of the Related Art

As demand for high-performance, high-speed, and/or multifunctional semiconductor devices increases, the degree of integration of the semiconductor devices also increases. In manufacturing semiconductor devices having micropatterns with high degree of integration, it is necessary to implement patterns having fine widths and spacings. For example, semiconductor devices including fin field effect transistors (FinFETs) with three-dimensional channels are being developed to overcome limitations in device characteristics caused by miniaturization of planar metal oxide semiconductor FETs (MOSFETs).

SUMMARY

According to an example embodiment, a semiconductor device may include a first active region and a second active region extending in a first direction on a substrate; a first insulating structure and a second insulating structure disposed on each of the first and second active regions and extending in the first direction; a plurality of channel layers disposed on each of the first and second insulating structures to be vertically spaced apart from each other; a first gate structure and a second gate structure intersecting each of the first and second active regions and the plurality of channel layers on the substrate to extend in a second direction and surrounding the plurality of channel layers; a first source/drain region disposed on the first insulating structure on at least one side of the first gate structure, contacting the plurality of channel layers, and doped with first conductivity-type impurities; and a second source/drain region disposed on the second insulating structure on at least one side of the second gate structure, contact the plurality of channel layers, and doped with second conductivity-type impurities, different from the first conductivity-type impurities. At least a portion of the first insulating structure extends upwardly of a side surface of the first source/drain region in the second direction, and at least a portion of the second insulating structure extends upwardly of a side surface of the second source/drain region in the second direction.

According to an example embodiment, a semiconductor device may include an active region extending in a first direction on a substrate; an insulating structure disposed on the active region and extending in the first direction; a plurality of channel layers disposed on the insulating structure to be vertically spaced apart from each other; a gate structure intersecting the active region and the plurality of channel layers on the substrate to extend in a second direction and surrounding the plurality of channel layers; and a source/drain region disposed on the insulating structure on at least one side of the gate structure and contacting the plurality of channel layers. The insulating structure contacts a lower surface of a lowermost channel layer, among the plurality of channel layers, and a lower surface of the source/drain region.

According to an example embodiment, a semiconductor device may include an active region extending in a first direction on a substrate; channel layers disposed on the active region to be spaced apart from each other; a first source/drain region and a second source/drain region disposed on the active region and contacting the channel layers; a gate structure intersecting the active region and the channel layers on the substrate to extend in a second direction; and a first insulating structure and a second insulating structure disposed on an upper surface of the active region while contacting a lower surface of each of the first and second source/drain regions. The first insulating structure includes a material, different from a material of the second insulating structure.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, example embodiments will be described with reference to the accompanying drawings.

Figure 1:
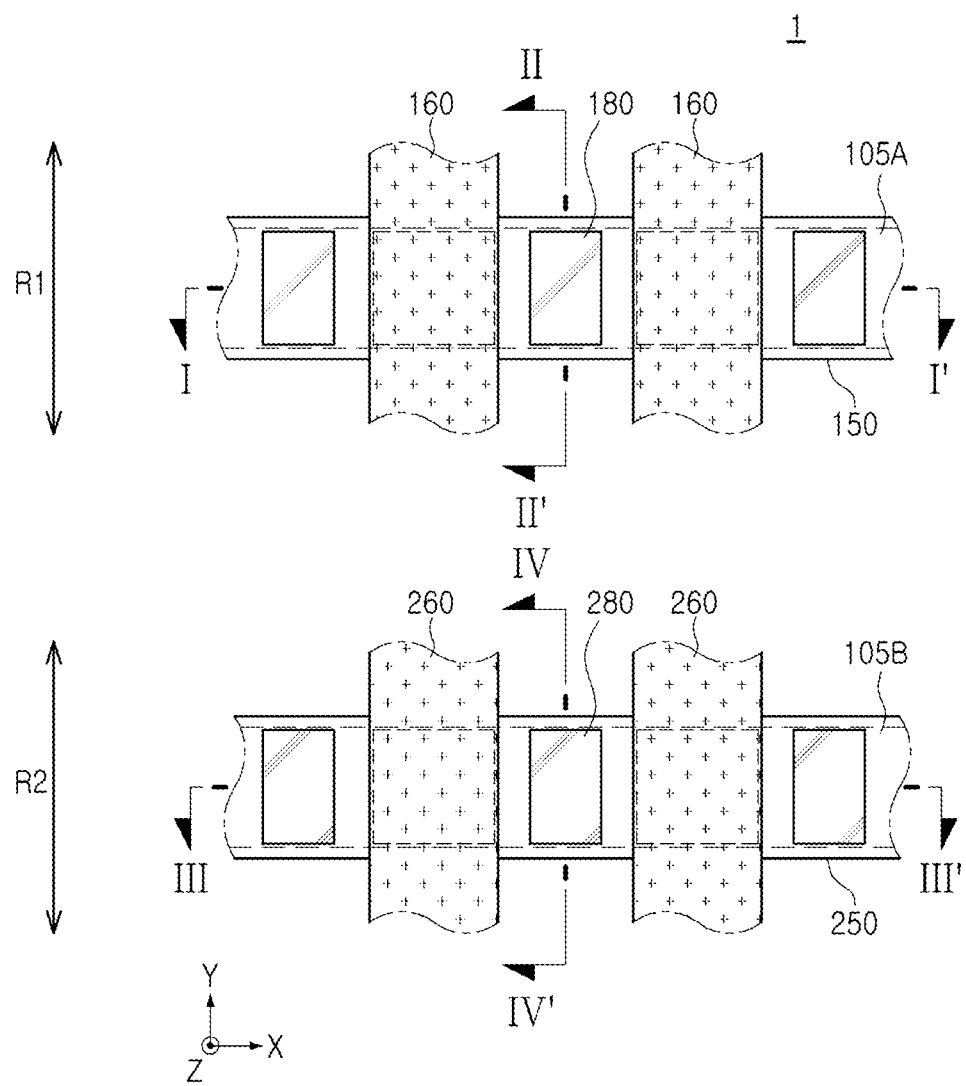
FIG. 1 illustrates a plan view of a semiconductor device according to example embodiments.
Figure 2:
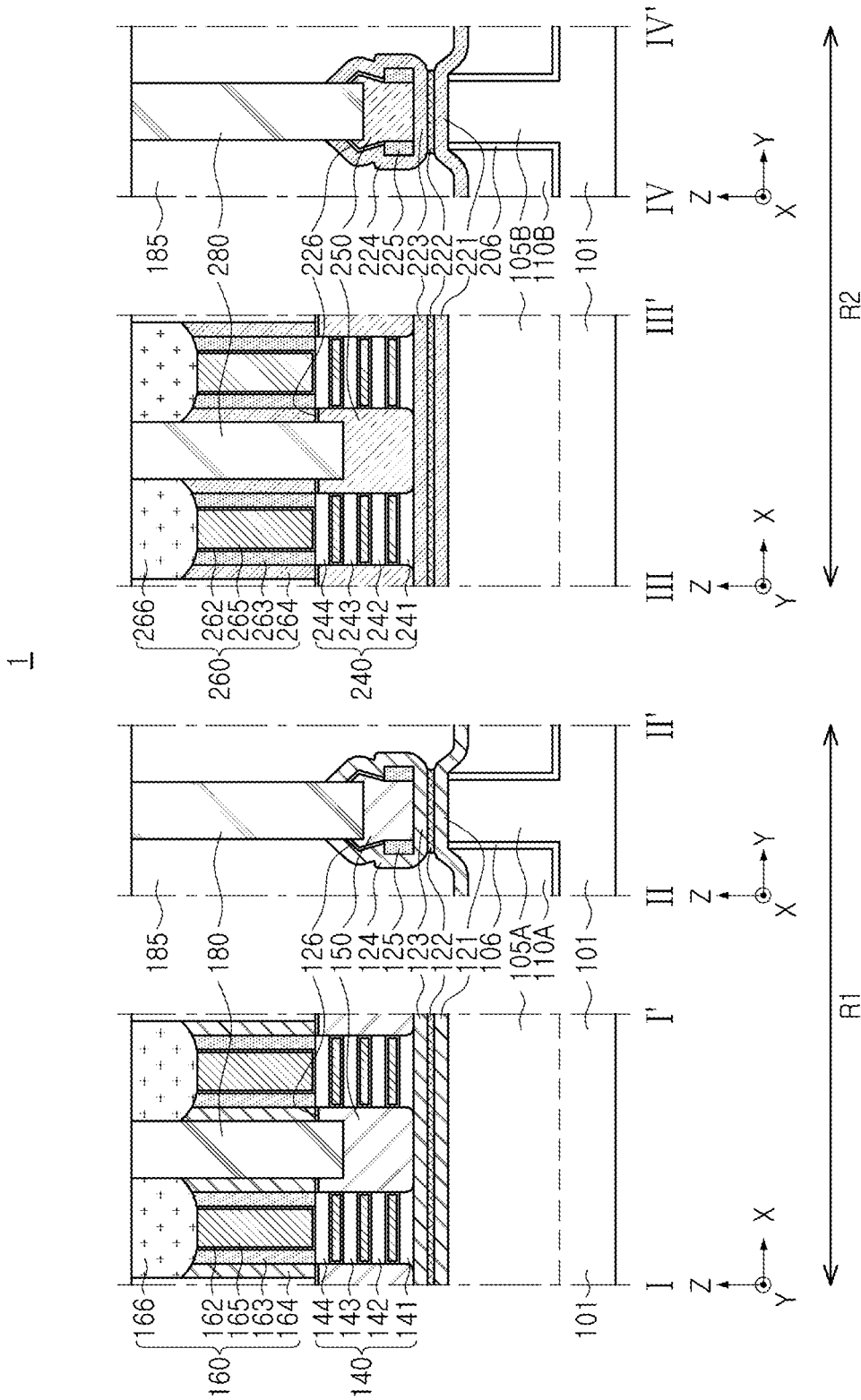
FIG. 2 illustrates cross-sectional views of a semiconductor device according to example embodiments.

FIG. 1 illustrates a plan view of a semiconductor device according to example embodiments. FIG. 2 illustrates cross-sectional views along lines I-I', and IV-IV' of FIG. 1. For ease of description, only main components of the semiconductor device are illustrated in FIGS. 1 and 2.

Referring to FIGS. 1 and 2, a semiconductor device 1 according to an example embodiment may include first and second regions R1 and R2. First and second semiconductor devices may be disposed in the first and second regions R1 and R2, respectively. For example, the first semiconductor device may include a p-type transistor (pFET), and the second semiconductor device may include an n-type transistor (nFET).

The first semiconductor device in the first region R1 may include a substrate 101, a first active region 105A on the substrate 101, a first insulating structure on the first active region 105A, a first channel structure 140 including a plurality of channel layers 141, 142, 143, and 144 vertically spaced apart from each other on the first insulating structure, a first gate structure 160 extending while intersecting the first active region 105A, a first source/drain region 150 in contact with the plurality of channel layers 141, 142, 143, and 144, and a first contact plug 180 connected to the first source/drain regions 150. The first semiconductor device may further include device isolation layers 110A. The first gate structure 160 may include a gate dielectric layer 162, a gate electrode 165, first and second spacer layers 163 and 164, and a gate capping layer 166.

The second semiconductor device in the second region R2 may include a second active region 105B on the substrate 101, a second insulating structure on the second active region 105B, a second channel structure 240 including a plurality of channel layers 241, 242, 243, and 244 disposed to be vertically spaced apart from each other on the second insulating structure, a second gate structure 260 extending while intersecting the second active region 105B, a second source/drain region 250 in contact with the plurality of channel layers 241, 242, 243, and 244, and a second contact plug 280 connected to the second source/drain regions 250. The second semiconductor device may further include device isolation layers 110B. The second gate structure 260 may include a gate dielectric layer 262, a gate electrode 265, first and second spacer layers 263 and 264, and a gate capping layer 266.

In the first semiconductor device, the first active region 105A may have a fin structure, and the gate electrode 165 may be disposed between the plurality of channel layers 141, 142, 143, and 144 of the channel structures 140 and on the channel structure 140. Accordingly, the first semiconductor device may include transistors, having a multi-bridge channel FET (MBCFET™) structure provided by the first channel structures 140, the first source/drain regions 150, and the first gate structures 160, gate-all-around field effect transistors.

The substrate 101 may have an upper surface extending in an X-direction and a Y-direction. The substrate 101 may include a semiconductor material, e.g., a group IV semiconductor, a group III-V compound semiconductor, or a group II-VI compound semiconductor. For example, the group IV semiconductor may include silicon (Si), germanium (Ge), or silicon-germanium (SiGe). The substrate 101 may be provided as, e.g., a bulk wafer, an epitaxial layer, a silicon-on-insulator (SOI) layer, a semiconductor-on-insulator (SeOI) layer, or the like.

The device isolation layers 110A and 110B may define active regions 105A and 105B in the substrate 101. The device isolation layers 110A and 110B may be formed by, e.g., a shallow trench isolation (STI) process. In some embodiments, the device isolation layers 110A and 110B may further include a region having a step and extending further downwardly of the substrate 101. The device isolation layers 110A and 110B may expose a portion of upper portions of the active regions 105A and 105B. In some embodiments, the device isolation layers 110A and 110B may have curved upper surfaces having a level increased in a direction toward the active regions 105A and 105B.

The active regions 105A and 105B may be defined by the device isolation layers 110A and 110B in the substrate 101, and may be disposed to extend in a first direction, e.g., the X-direction. The active regions 105A and 105B may have a structure protruding from the substrate 101. Upper ends of the active regions 105A and 105B may be disposed to protrude from the upper surfaces of the device isolation layers 110A and 110B to a predetermined height. The active regions 105A and 105B may be formed as a portion of the substrate 101, or may include an epitaxial layer grown from the substrate 101. Liners 106 and 206 may be disposed on side surfaces, adjacent to the device isolation layers 110A and 110B, of the active regions 105A and 105B, respectively. The liners 106 and 206 may include an insulating material, e.g., a silicon nitride. The liners 206 on the device isolation layers 110B may be in the second semiconductor device in the second region R2, as will be described in more detail below.

The first insulating structure may include a plurality of layers including first to third lower insulating layers 121, 122, and 123. The first insulating structure may be disposed on the first active region 105A. The first insulating structure may be disposed to be in contact with an upper surface of the first active region 105A and to be in contact with lower surfaces of the channel layer 141 and the first source/drain region 150.

The first lower insulating layer 121 and the third lower insulating layer 123 may include the same material, and the second lower insulating layer 122 may include a material different from the material of the first and third lower insulating layers 121 and 123. For example, each of the first to third lower insulating layers 121, 122, and 123 may include at least one of SiN, SiO, SiCN, SiOC, SiON, SiOCN, and SiBCN.

The first lower insulating layer 121 may be disposed to overlap the active region 105A on the upper surface of the active region 105A. The first lower insulating layer 121 may extend along the active region 105A in the first direction, e.g., the X-direction. Also, the first lower insulating layer 121 may extend in the second direction, e.g., the Y-direction. For example, the first lower insulating layer 121 may be disposed to cover at least a portion of the upper surface of the device isolation layer 110A.

The second lower insulating layer 122 may be disposed to overlap the first lower insulating layer 121 on the upper surface of the first lower insulating layer 121. The second lower insulating layer 122 may extend in the first direction, e.g., in the X-direction along the active region 105A. A width of the second lower insulating layer 122 in the Y-direction may be substantially the same as or similar to a width of the first active region 105A in the Y-direction, e.g., the second lower insulating layer 122 and the first active region 105A may completely overlap and cover each other vertically (i.e., in a top view).

The third lower insulating layer 123 may be disposed to overlap the second lower insulating layer 122 on the upper surface of the second lower insulating layer 122. The third lower insulating layer 123 may extend along the first active region 105A in the first direction, e.g., in the X-direction. The third lower insulating layer 123 may extend upwardly of a side surface of the first source/drain region 150, e.g., portions of the third lower insulating layer 123 beyond the second lower insulating layer 122 may curve along a side surface of the first source/drain region 150 toward the first contact plug 180. In an example embodiment, the third lower insulating layer 123 may surround an entire surface of the first source/drain region 150, e.g., the third lower insulating layer 123 may continuously extend along and conformally cover a bottom surface (which faces the first active region 105A) and side surfaces (which extend from the bottom surface toward the first contact plug 180) of the first source/drain region 150.

Each of the first to third lower insulating layers 121, 122, and 123 may have a uniform thickness. In addition, the first and third lower insulating layers 121 and 123 may have the same thickness, and the second lower insulating layer 122 may have a thickness the same as or different from a thickness of each of the first and third lower insulating layers 121 and 123. In an example embodiment, the thickness of the second lower insulating layer 122 may be lower than that of each of the first and third lower insulating layers 121 and 123. The sum of the thicknesses of the first to third lower insulating layers 121, 122, and 123 may be about 10 nm to about 100 nm. When the sum is less than the above range, an effect of blocking a leakage current between adjacent source/drain regions may be insufficient. When the sum exceeds the above range, the thickness of the insulating layer may be increased to cause inefficiency in a process.

A first side insulating layer 125 may be disposed to cover at least a portion of a side surface of the first source/drain region 150. The first side insulating layer 125 may be disposed, e.g., directly, between a side surface of the first source/drain region 150 in the Y-direction and the third lower insulating layer 123 extending upwardly along the side surface of the first source/drain region 150. The first side insulating layer 125 may include at least one of, e.g., SiN, SiO, SiCN, SiOC, SiON, SiOCN, and SiBCN.

A first passivation layer 126 may be disposed to cover at least a portion of a side surface of the first source/drain region 150 in the Y-direction. The first passivation layer 126 may be disposed, e.g., directly, between the side surface of the first source/drain region 150 and the third lower insulating layer 123 extending upwardly of the side surface of the first source/drain region 150. The first passivation layer 126 may be disposed to surround a side surface of the first source/drain region 150 which is not surrounded by the first side insulating layer 125, e.g., the first passivation layer 126 and the first side insulating layer 125 may be on different parts of the side surface of the first source/drain region 150. The first passivation layer 126 may include silicon (Si).

For example, the side surface of the first source/drain region 150 in the X-direction may be in contact with the first channel structure 140, at least a portion of a side surface of the first source/drain region 150 in the Y-direction may be in contact with the first side insulating layer 125, and the remaining portion of the side surface of the first source/drain region 150 in the Y-direction may be in contact with the first passivation layer 126.

The second insulating structure may include a plurality of layers including fourth to sixth lower insulating layers 221, 222, and 223. The second insulating structure may be disposed on the second active region 105B. The second insulating structure may be disposed to be in contact with an upper surface of the second active region 105B and to be in contact with lower surfaces of the channel layer 241 and the second source/drain region 250.

The fourth lower insulating layer 221 and the sixth lower insulating layer 223 may include the same material, and the fifth lower insulating layer 222 may include a material different from the material of the fourth and sixth lower insulating layers 221 and 223. The fourth and sixth lower insulating layers 221 and 223 may include a material different from that of the first and third lower insulating layers 121 and 123. For example, the first insulating structure, disposed below the first source/drain region 150 and the first channel structure 140, may include a material different from that of the second insulating structure disposed below the second source/drain region 250 and the second channel structure 240.

The first channel structure 140 may include two or more channel layers disposed on the first active region 105A and spaced apart from each other in a direction, perpendicular to the upper surface of the first active region 105A, e.g., a Z-direction. The first channel structure 140 may be spaced apart from the upper surface of the first active region 105A while being connected to the first source/drain region 150. A lower surface of the first channel layer 141 may be in contact with an upper surface of the third lower insulating layer 123. The first to fourth channel layers 141, 142, 143, and 144 may have a width in the X-direction that is the same as or similar to a width of the first active region 105A in the Y-direction, and may have the width in the X-direction narrower than a width of the first gate structure 160 in the X-direction. For example, the first to fourth channel layers 141, 142, 143, and 144 may have a width the same as or similar to a width of a stack of the gate electrode 165, the gate dielectric layer 162, and the first spacer layers 163 in the X-direction. The first to fourth channel layers 141, 142, 143, and 144 may have decreased widths such that side surfaces thereof are disposed below the first gate structure 160 in the X-direction, e.g., the width of the first to fourth channel layers 141, 142, 143, and 144 may be smaller than the width of the first gate structure 160 in the X-direction.

The first to fourth channel layers 141, 142, 143, and 144 may be formed of a semiconductor material, and may include at least one of, e.g., silicon (Si), silicon germanium (SiGe), and germanium (Ge). For example, the first to fourth channel layers 141, 142, 143, and 144 may be formed of the same material as the substrate 101. The number and shape of the channel layers 141, 142, 143, and 144, constituting a single channel structure 140, may vary according to example embodiments. In another example, unlike FIG. 2, the first channel layer 141 may be formed to be spaced apart from an upper surface of the third lower insulating layer 123, so that the gate electrode 165 may be formed between the first channel layer 141 and the third lower insulating layer 123.

The first source/drain regions 150 may be disposed on the first insulating structure on opposite sides adjacent to the first channel structure 140, e.g., the first source/drain regions 150 may be on the first insulating structure between two adjacent first channel structures 140. The first source/drain region 150 may be disposed on, e.g., contact, a side surface of each of the first to fourth channel layers 141, 142, 143, and 144 of the first channel structure 140 and an upper surface of the third lower insulating layer 123 on a lower end of the first source/drain region 150. The first source/drain region 150 may be disposed by recessing a portion of an upper portion of the first insulating structure. However, recessing the first source/drain region 150 and recess depth thereof may vary according to example embodiments. The first source/drain regions 150 may be formed of, e.g., silicon-germanium (SiGe), and may include first conductivity-type impurities. For example, the first source/drain regions 150 may include p-type impurities, e.g., boron (B), indium (In), gallium (Ga), boron trifluoride ($BF_3$), or the like. Also, the first source/drain regions 150 may include single-crystalline silicon-germanium.

Each of the first source/drain regions 150 may have a cross-section having a pentagonal, hexagonal, or similar shape in the Y-direction. However, in some embodiments, the first source/drain regions 150 may have various shapes, e.g., one of a polygonal shape, a circular shape, and a rectangular shape. In addition, the first source/drain regions 150 may have an upper surface having a substantially planar cross-section in the X-direction, and may have a shape curved downwardly from the upper surface, e.g., a portion of a circle, a portion of an ellipse, or a similar shape. However, according to example embodiments, such a shape may vary depending on a distance between adjacent first gate structures 160 and a height of the first active region 150.

The first gate structure 160 may intersect the first active region 105A and the first channel structures 140 on the first active region 105A and the first channel structures 140 to extend in one direction, e.g., the Y-direction. Channel regions of transistors may be formed in the first active region 105A and/or the first channel structures 140 intersecting the first gate structure 160. The first gate structure 160 may include the gate electrode 165, the gate dielectric layer 162 between the gate electrode 165 and the plurality of channel layers 141, 142, 143, and 144, the first and second spacers 163 and 164 on side surfaces of the gate electrode 165, and the gate capping layer 166 on an upper surface of the gate electrode 165.

The gate dielectric layer 162 may be disposed between the first active region 105A and the gate electrode 165, and between the channel structure 140 and the gate electrode 165, and may be disposed to cover at least a portion of surfaces of the gate electrode 165. For example, the gate dielectric layer 162 may be disposed to surround all surfaces, other than an uppermost surface of the gate electrode 165. The gate dielectric layer 162 may extend between the gate electrode 165 and the spacer layers 164, but example embodiments are not limited thereto. The gate dielectric layer 162 may include, e.g., an oxide, a nitride, or high-k dielectric material. The high-k dielectric material may refer to a dielectric material having a dielectric constant higher than that of silicon oxide ($SiO_2$). The high-k dielectric material may be one of, e.g., aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 165 may be disposed on the first active region 105A to fill spaces between the plurality of channel layers 141, 142, 143, and 144 and to extend upwardly of the channel structure 140. The gate electrode 165 may be spaced apart from the plurality of channel layers 141, 142, 143, and 144 by the gate dielectric layer 162. The gate electrode 165 may include a conductive material, e.g., a metal nitride (e.g., titanium nitride (TiN), tantalum nitride (TaN), or tungsten nitride (WN)), a metal (e.g., aluminum (Al), tungsten (W), or molybdenum (Mo)), and/or a semiconductor material (e.g., doped polysilicon). The gate electrode 165 may have a multilayer structure including two or more layers. According to the configuration of the semiconductor device 1, the gate electrode 165 may be disposed to be separated by an additional separation portion between at least some transistors adjacent to each other.

The first and second spacer layers 163 and 164 may be disposed on opposite side surfaces of the gate electrode 165. The first spacer layer 163 may be disposed on a side surface of the gate electrode 165, and the second spacer layer 164 may be disposed on a side surface of the first spacer layer 163, e.g., the first spacer layer 163 may be between the gate electrode 165 and the second spacer layer 164. The first and second spacer layers 163 and 164 may insulate the source/drain regions 150 from the gate electrodes 165. The number and shape of the spacer layers 163 and 164 may vary according to example embodiments. For example, the spacer layers 163 and 164 may be formed of, e.g., an oxide, a nitride, an oxynitride, or a low-k dielectric material.

The gate capping layer 166 may be disposed on the gate electrode 165. The gate capping layer 166 may have a lower surface surrounded by the gate electrode 165 and the spacer layers 164.

The first contact plug 180 may penetrate through the interlayer insulating layer 185 to be connected to the first source/drain region 150, and may apply an electrical signal to the first source/drain region 150. The first contact plug 180 may be disposed to be electrically connected to the first source/drain region 150, as illustrated in FIG. 2. For example, as illustrated in FIG. 2, the first contact plug 180 may extend so that a width of an upper portion and a width of a lower portion are substantially constant. However, embodiments are not limited thereto, e.g., the first contact plug 180 may have an inclined surface in which a width of a lower portion is narrower than a width of an upper portion depending on an aspect ratio. For example, the first contact plug 180 may extend from the upper portion to be lower than the fourth channel layer 144, e.g., a distance from a bottom of the first contact plug 180 to a bottom of the substrate 101 may be smaller than a distance from a bottom of the fourth channel layer 144 to the bottom of the substrate 101. For example, the first contact plug 180 may be recessed to a height corresponding to an upper surface of the third channel layer 143, e.g., the bottom of the first contact plug 180 may be coplanar with a top of the third channel layer 143. In example embodiments, the first contact plug 180 may also be disposed to be in, e.g., direct, contact with the source/drain region 150 along an upper surface of the source/drain region 150 without recessing the source/drain region 150. For example, the first contact plug 180 may include a metal nitride, e.g., titanium nitride (TiN), tantalum nitride (TaN), or tungsten nitride (WN), and/or a metal e.g., aluminum (Al), tungsten (W), or molybdenum (Mo).

The interlayer insulating layer 185 may cover the first source/drain regions 150 and the first gate structures 160, and may be disposed to cover the first device isolation layer 110A, as illustrated in FIG. 2. The interlayer insulating layer 185 may include at least one of, e.g., an oxide, a nitride, an oxynitride, or a low-k dielectric material.

As illustrated with the same hatching in FIG. 2, components of the first gate structure 160 may include the same material as the insulating layers. For example, the first spacer layer 163 and the first side insulating layer 125 may include the same material and may have substantially the same thickness, e.g., the width of the first spacer layer 163 in the X-direction may equal the width of the first side insulating layer 125 in the Y-direction. In addition, the second spacer layer 164, the first lower insulating layer 121, and the third lower insulating layer 123 may include the same material and may have substantially the same thickness, e.g., the width of the second spacer layer 164 in the X-direction may equal the width of each of the first lower insulating layer 121 and the third lower insulating layer 123.

Next, the second semiconductor device disposed in the second region R2 will be described. Descriptions overlapping the above description regarding the first semiconductor element, among the components of the second semiconductor element, will be omitted.

In the second semiconductor device, the active region 105B may have a fin structure, and the gate electrode 265 may be disposed between the plurality of channel layers 241, 242, 243, and 244 of the channel structures 240 and on the channel structure 240. Accordingly, the second semiconductor device may include a gate-all-around field effect transistor provided by the second channel structures 240, the second source/drain regions 250, and the second gate structures 260.

The second source/drain regions 250 may be formed of silicon (Si), and may include second conductivity-type impurities, different from the first conductivity-type impurities of the first source/drain regions 150. For example, the second source/drain regions 250 may include n-type impurities, e.g., phosphorus (P), nitrogen (N), arsenic (As), or antimony (Sb). Also, the second source/drain regions 250 may include single-crystalline silicon (Si).

The second insulating structure may include a plurality of layers including the fourth to sixth lower insulating layers 221, 222, and 223. The second insulating structure may be disposed on the second active region 105B. The second insulating structure may be disposed to be in contact with an upper surface of the second active region 105B and to be in contact with lower surfaces of the channel layer 241 and the second source/drain region 250.

The fourth lower insulating layer 221 and the sixth lower insulating layer 223 may include the same material, and the fifth lower insulating layer 222 may have a material, different from the material of the fourth and sixth lower insulating layers 221 and 223. For example, each of the fourth to sixth lower insulating layers 221, 222, and 223 may include at least one of SiN, SiO, SiCN, SiOC, SiON, SiOCN, and SiBCN.

Each of the fourth to sixth lower insulating layers 221, 222, and 223 may have a substantially uniform thickness. The fourth and sixth lower insulating layers 221 and 223 may have substantially the same thickness, and the fifth lower insulating layer 222 may have a thickness the same as or different from a thickness of the fourth and sixth lower insulating layers 221 and 223. In an example embodiment, the thickness of the fifth lower insulating layer 222 may be lower than the thickness of each of the fourth and sixth lower insulating layers 221 and 223.

The fourth and sixth lower insulating layers 221 and 223 may include a material, different from that of the first and third lower insulating layers 121 and 123. For example, the first insulating structure may include a material, different from that of the second insulating structure. The fifth lower insulating layer 222 may include a material the same as or different from that of the second lower insulating layer 122.

A second side insulating layer 225 may be disposed to cover at least a portion of a side surface of the second source/drain region 250. The second side insulating layer 225 may be disposed between the side surface of the second source/drain region 250 and the sixth lower insulating layer 223 extending upwardly of the side surface of the second source/drain region 250. The second side insulating layer 225 may include at least one of, e.g., SiN, SiO, SiCN, SiOC, SiON, SiOCN, and SiBCN.

A second passivation layer 226 may be disposed to cover at least a portion of a side surface of the second source/drain region 250. The second passivation layer 226 may be disposed between the side surface of the second source/drain region 250 and the sixth lower insulating layer 223 extending upwardly of the side surface of the second source/drain region 250. The second passivation layer 226 may be disposed to surround a side surface of the second source/drain region 250 that is not surrounded by the second side insulating layer 225. The second passivation layer 226 may include silicon (Si).

For example, the side surface of the second source/drain region 250 in the X-direction may be in contact with the second channel structure 240, at least a portion of the side surface of the second source/drain region 250 in the Y-direction may be in contact with the second side insulating layer 225, and the remaining portion of the side surface of the second source/drain region 250 in the Y-direction may be in contact with the second passivation layer 226.

The second gate structure 260 may intersect the second active region 105B and the second channel structures 240 on the second active region 105B to extend in one direction, e.g., the Y-direction. Channel regions of transistors may be formed in the second active region 105B and/or the second channel structures 240 intersecting the second gate structure 260. The second gate structure 260 may include a second gate electrode 265, a second gate dielectric layer 262 between the gate electrode 265 and the plurality of channel layers 241, 242, 243, and 244, third and fourth spacer layers 263 and 264 on side surfaces of the second gate electrode 265, and a second gate capping layer 266 on an upper surface of the second gate electrode 265.

Referring to the example embodiment illustrated in FIG. 2, the components of the second gate structure 260 may include the same material as the insulating layers 221, 222, 223, 224 and 225. For example, the third spacer layer 263 and the second side insulating layer 225 may include the same material and may have substantially the same thickness. In addition, the third spacer layer 263, the second side insulating layer 225, the first spacer layer 163, and the first side insulating layer 125 may include the same material and may have substantially the same thickness. In addition, the fourth spacer layer 264, the fourth lower insulating layer 221, and the sixth lower insulating layer 223 may include the same material and may have substantially the same thickness.

FIGS. 3 to 6 are cross-sectional views of semiconductor devices according to example embodiments. In example embodiments of FIGS. 3 to 6, the same reference numerals as in FIGS. 1 and 2 denote corresponding components, and descriptions overlapping the above descriptions will be omitted. In the example embodiment of FIGS. 3 to 6, a case of having the same reference numerals as those of FIGS. 1 and 2 but having different alphabetical characters is provided to describe an example embodiment different from the example embodiment of FIGS. 1 and 2, and features described with the same reference numerals described above may be the same or similar.

Figure 3:
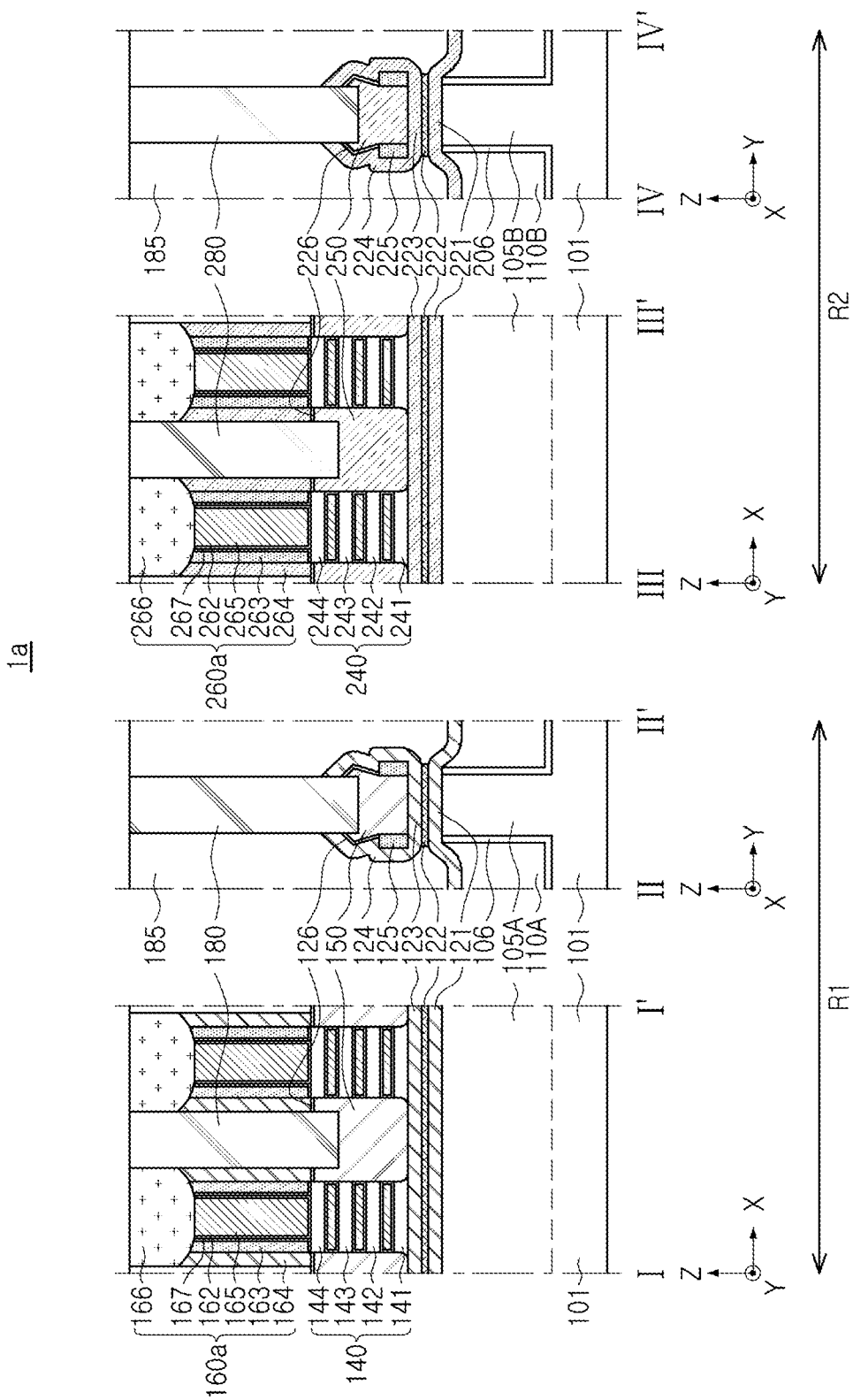
FIG. 3 illustrates cross-sectional views of a semiconductor device according to example embodiments.

Referring to FIG. 3, in a first semiconductor device 1a, a first gate structure 160a may further include a fifth spacer layer 167, and a second gate structure 260a may additionally include a seventh spacer layer 267. Each of the fifth and seventh spacer layers 167 and 267 may include at least one of, e.g., SiN, SiO, SiCN, SiOC, SiON, SiOCN, and SiBCN. The fifth spacer layer 167 may be disposed between the first gate electrode 165 and the first spacer layer 163, and may extend to cover a portion of an upper surface of an uppermost channel layer 144. The seventh spacer layer 267 may be disposed between the second gate electrode 265 and the third spacer layer 263, and may extend to cover a portion of an upper surface of an uppermost channel layer 244.

Figure 4:
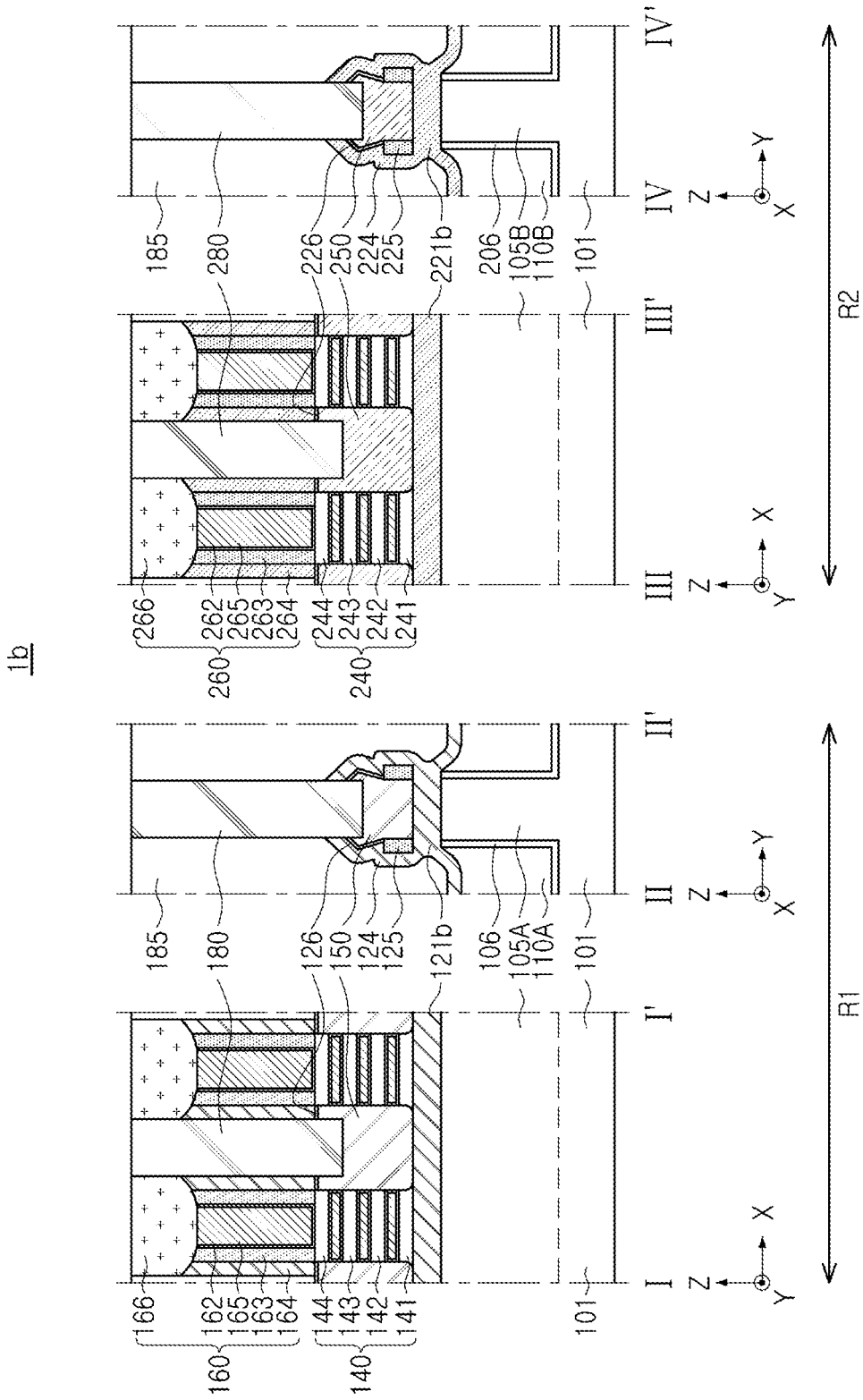
FIG. 4 illustrates cross-sectional views of a semiconductor device according to example embodiments.

Referring to FIG. 4, in a semiconductor device 1b, the first insulating structure may include a single layer, and the second insulating structure may include a single layer. That is, in the first semiconductor device 1b, a lower insulating layer 121b of the first insulating structure may extend to cover a surface of the first source/drain region 150. For example, as illustrated in FIG. 4, the lower insulating layer 121b may be a single layer, e.g., continuously, covering upper surfaces of the first device isolation layer 110A and the first active regions 105A, and a portion of the lower insulating layer 121b, i.e., a first lateral insulating layer 124, may extend upwardly from the lower insulating layer 121b to, e.g., continuously, cover the side surfaces of the first source/drain region 150. A thickness of the lower insulating layer 121b may be approximately twice a thickness of the first lateral insulating layer 124. Similarly, a lower insulating layer 221b of the second insulating structure may extend to cover a surface of a second source/drain region 250 via a second lateral insulating layer 224. A thickness of the lower insulating layer 221b may be approximately twice a thickness of the second lateral insulating layer 224.

Figure 5:
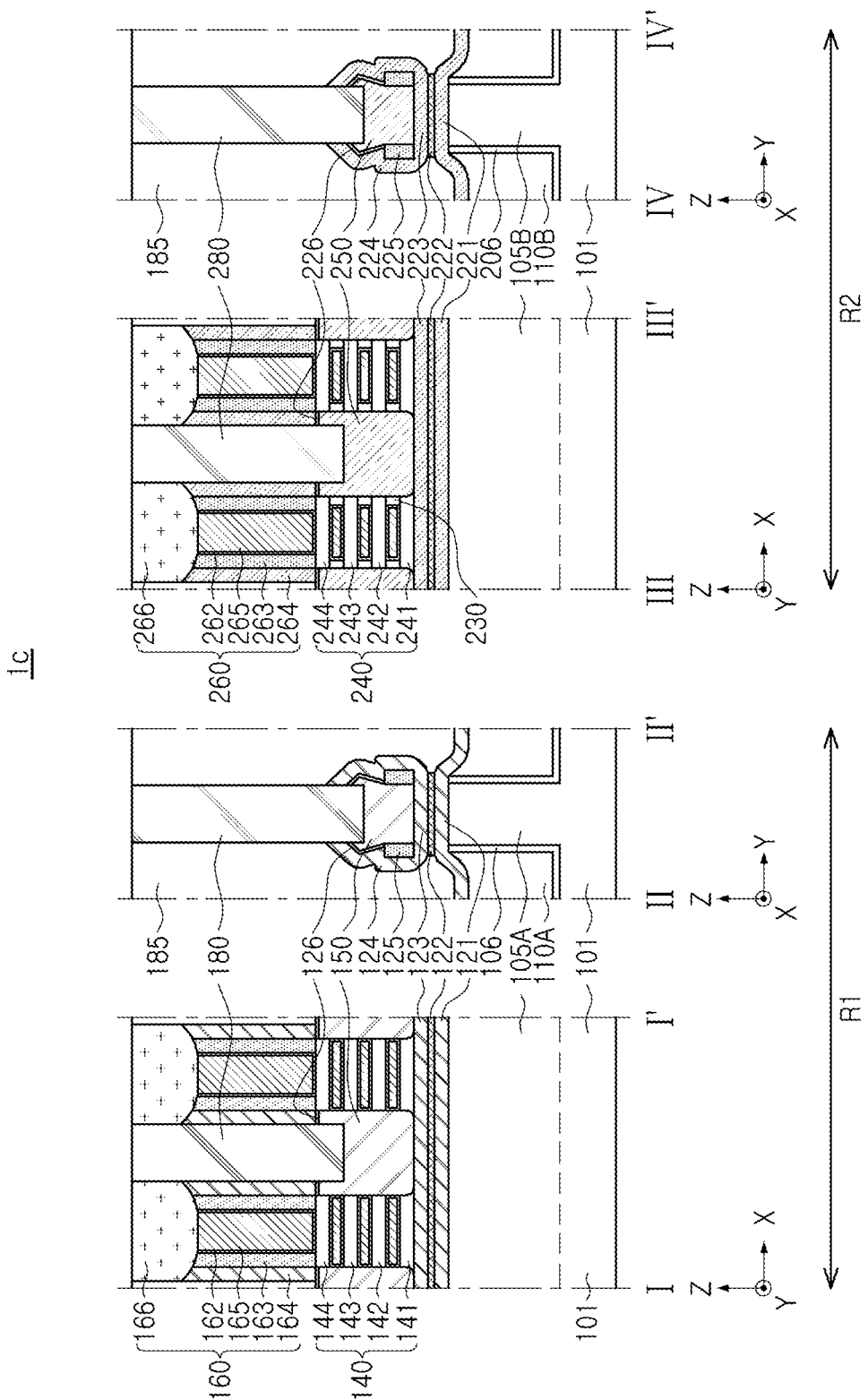
FIG. 5 illustrates cross-sectional views of a semiconductor device according to example embodiments.

Referring to FIG. 5, in a semiconductor device 1c, a second semiconductor device disposed in a second region R2 may further include internal spacer layers 230. The internal spacer layers 230 may be disposed to be parallel to the second gate electrode 265 between the second channel structures 240. The second gate electrode 265 may be spaced apart from second source/drain regions 250 by the internal spacer layers 230 to be electrically separated from each other, below the fourth channel layer 244. The internal spacer layers 230 may have a shape in which a side surface, opposing the second gate electrode 265, is rounded to be convex inwardly toward the second gate electrode 265, but example embodiments are not limited thereto. The internal spacer layers 230 may be formed of, e.g., an oxide, a nitride, an oxynitride, or a low-k dielectric material.

Meanwhile, the first semiconductor device disposed in the first region R1 may also include the internal spacer layers 230. The internal spacer layers 230 may be disposed to be parallel to the first gate electrode 165 between the first channel structures 140. In an example embodiment, both the first semiconductor device disposed in the first region R1 and the second semiconductor device disposed in the second region R2 may include the internal spacer layers 230.

Figure 6:
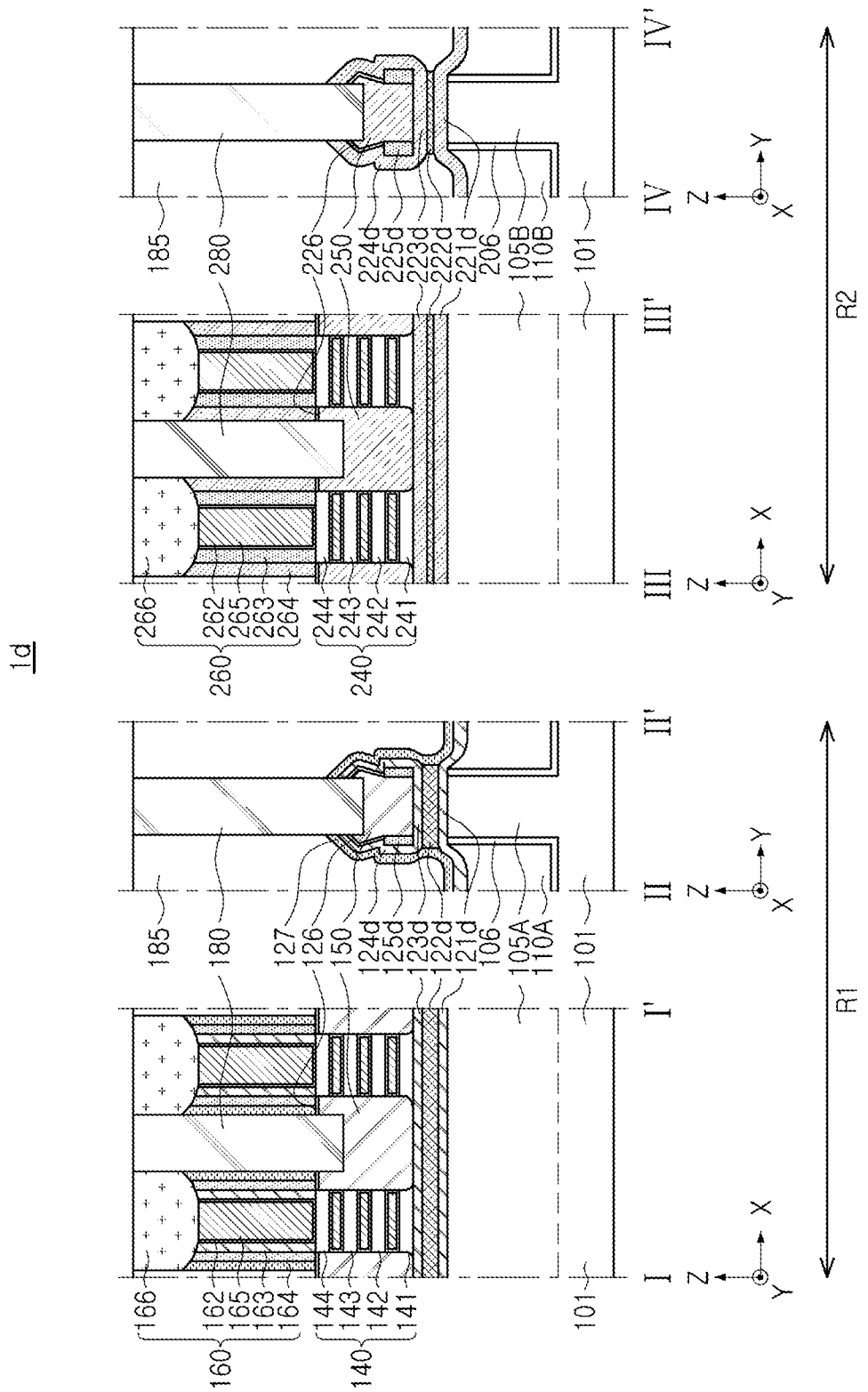
FIG. 6 illustrates cross-sectional views of a semiconductor device according to example embodiments.

Referring to FIG. 6, in a semiconductor device 1d, the first semiconductor device disposed in the first region R1 may further include a seventh insulating layer 127 surrounding a side surface of a source/drain region 150. The seventh insulating layer 127 may include a material different from that of first to third lower insulating layers 121d, 122d, and 123d. In an example embodiment, the seventh insulating layer 127 may be formed simultaneously with fourth and sixth lower insulating layers 221d and 223d of the second semiconductor device disposed in the second region R2, and may be formed of the same material as the fourth and sixth lower insulating layers 221d and 223d. The seventh insulating layer 127 of the first semiconductor device may be formed to have the same thickness as each of the first lower insulating layer 121d and the third lower insulating layer 123d. In an example embodiment, the first, third, and seventh lower insulating layers 121d, 123d, and 127 of the first semiconductor device may be formed to have a thickness lower than a thickness of the fourth and sixth lower insulating layers 221d and 223d of the second semiconductor device. In an example embodiment, the thickness of the second lower insulating layer 122d of the first semiconductor device may be higher than the thickness of the fifth lower insulating layer 222d of the second semiconductor device.

FIGS. 7A to 7G illustrate cross-sectional views of stages in a method of fabricating a semiconductor device according to example embodiments. In FIGS. 7A to 7G, an example embodiment of a method of fabricating the semiconductor device of FIG. 2 will be described and cross-sections corresponding to FIG. 2 are illustrated.

Figure 7A:
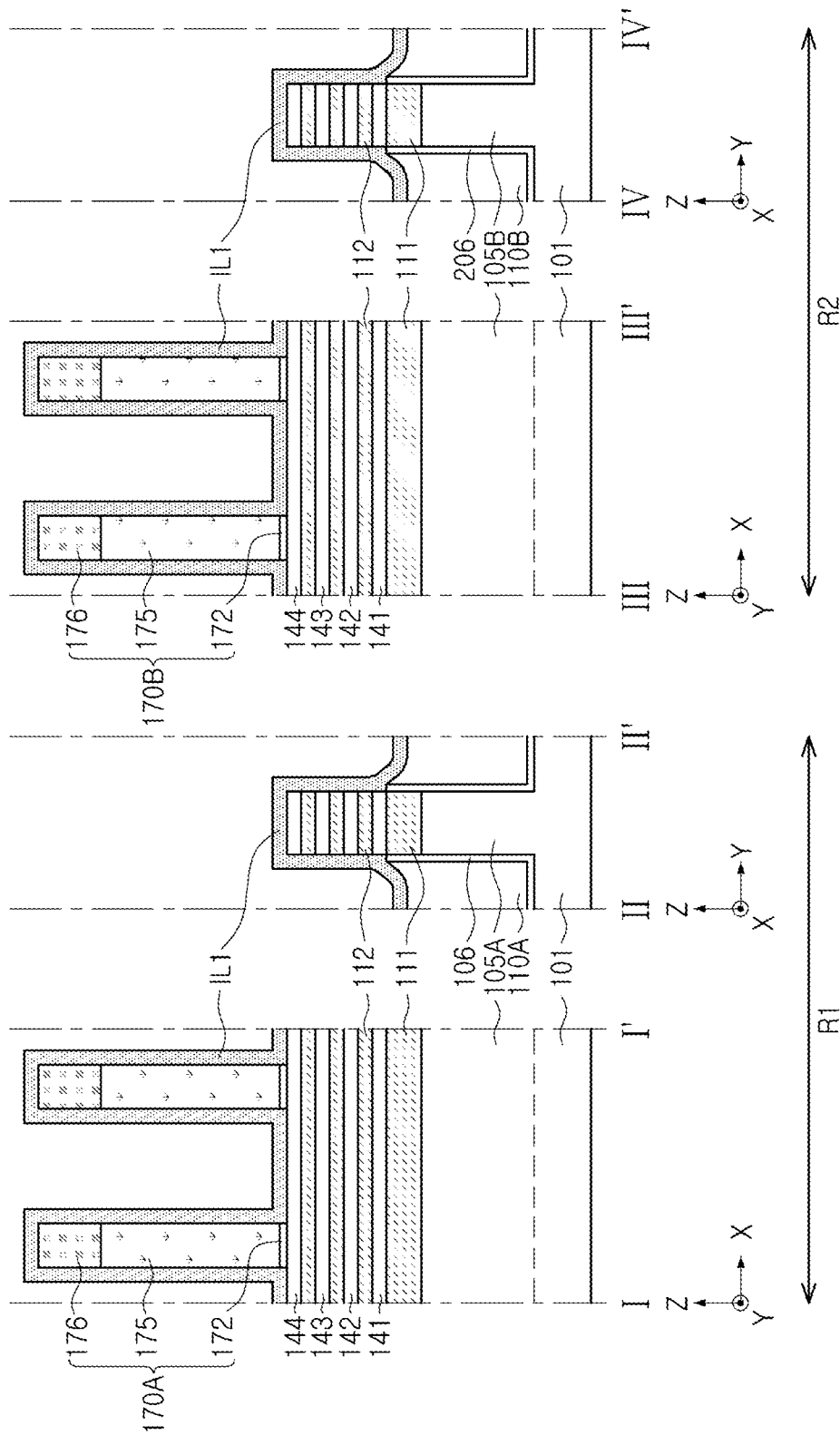
FIGS. 7A to 7G illustrate cross-sectional views of stages in a method of fabricating a semiconductor device according to example embodiments.

Referring to FIG. 7A, in the first and second regions R1 and R2 of the substrate 101, sacrificial layers 111, 112, 113, and 114 and channel layers 141, 142, 143 and 144 may be alternately stacked on the active regions 105A and 105B to form active structures. In addition, in the first and second regions R1 and R2 of the substrate 101, sacrificial gate structures 170 may be formed on the active structures, and a first insulating layer IL1 may be conformally formed to cover the first sacrificial gate structure 170 and the active structures.

The sacrificial layers 112, 113, and 114 may be replaced with the gate dielectric layers 162 and 262, and the gate electrodes 165 and 265 in a subsequent process, as illustrated in FIG. 2. A lowermost sacrificial layer 111 may be replaced with the first and second insulating structures in a subsequent process, as illustrated in FIG. 2.

The sacrificial layers 111, 112, 113, and 114 may be formed of a material having etching selectivity with respect to the channel layers 141, 142, 143, and 144. The channel layers 141, 142, 143, and 144 may include a material different from that of the sacrificial layers 111, 112, 113, and 114. For example, the sacrificial layers 111, 112, 113, and 114, and the channel layers 141, 142, 143, and 144 may include a semiconductor material, e.g., at least one of silicon (Si), silicon germanium (SiGe), and germanium (Ge), but may include different materials, and may or may not include impurities. For example, the sacrificial layers 111, 112, 113, and 114 may include silicon germanium (SiGe), and the channel layers 141, 142, 143, and 144 may include silicon (Si).

Thicknesses of the sacrificial layers 111, 112, 113, and 114 may be the same or different from each other. In an example embodiment, the thickness of the lowermost sacrificial layer 111, replaced with the insulating structure, may be higher than the thickness of each of the other sacrificial layers 112, 113, and 114. In this case, an impurity concentration of the lowermost sacrificial layer 111 may be higher than an impurity concentration of each of the other sacrificial layers 112, 113, and 114. Accordingly, an etching rate of the lowermost sacrificial layer 111 may be set to be higher than an etching rate of the other sacrificial layers 112, 113, and 114 to simultaneously remove the lowermost sacrificial layer 111 and the other sacrificial layers 112, 113, and 114. Each of the sacrificial layers 111, 112, 113, and 114 and the channel layers 141, 142, and 143 may have a thickness ranging from about 1 angstrom to about 100 nm. The lowermost sacrificial layer 111 may have an impurity concentration of about 20 at % to about 50 at %.

The number of layers of the sacrificial layers 111, 112, 113, and 114 and the channel layers 141, 142, 143, and 144, alternately stacked, may vary according to example embodiments. For example, the number of the sacrificial layers and the number of the channel layers may each be three or more.

A sacrificial gate structures 170 may be sacrificial structures formed in regions in which the gate dielectric layers 162 and 262 and the gate electrodes 165 and 265 are to be disposed on the channel structures 140 and 240 in a subsequent process, as illustrated in FIG. 2. The sacrificial gate structure 170 may include first and second sacrificial gate layers 172 and 175, and a mask pattern layer 176 sequentially stacked. The first and second sacrificial gate layers 172 and 175 may be patterned using the mask pattern layer 176. The first and second sacrificial gate layers 172 and 175 may be an insulating layer and a conductive layer, respectively. However, example embodiments are not limited thereto, e.g., the first and second sacrificial gate layers 172 and 175 may be formed as a single layer. For example, the first sacrificial gate layer 172 may include a silicon oxide, and the second sacrificial gate layer 175 may include polysilicon. The mask pattern layer 176 may include a silicon oxide and/or a silicon nitride. The sacrificial gate structures 170 may have a line shape intersecting the active structures to extend in one direction. The sacrificial gate structures 170 may extend in, e.g., the Y-direction, and may be disposed to be spaced apart from each other in the X-direction. The first insulating layer IL1 may include at least one of, e.g., SiN, SiO, SiCN, SiOC, SiON, SiOCN, and SiBCN.

Figure 7B:
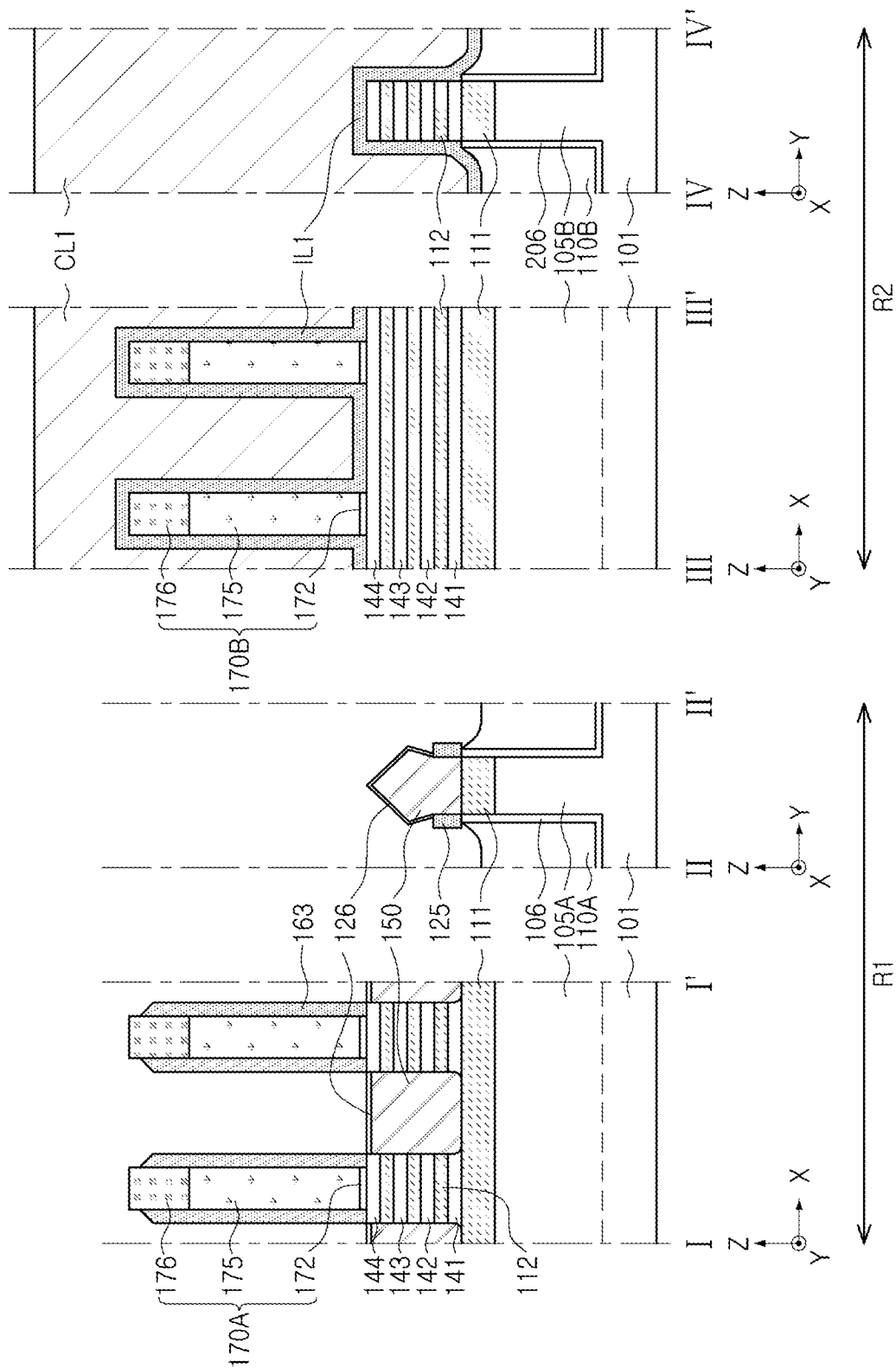

Referring to FIG. 7B, in the second region R2 of the substrate 101, a first capping layer CL1 may be formed to cover the sacrificial gate structures 170 and the active structure. After the first capping layer CL1 is formed in the second region R2, a portion of the first insulating layer IL1 in the first region R1 may be etched to be removed. For example, the first insulating layer IL1 formed on upper surfaces of the mask pattern layers 176 of the sacrificial gate structures 170 may be removed, and a portion of the first insulating layer IL1 formed on side surfaces adjacent to the upper surfaces of the mask patterns 176 may be removed together. As a result, the first spacer layers 163 may be formed on the side surfaces of the sacrificial gate structures 170. In addition, the first insulating layer IL1 formed on an upper surface of the active structure between adjacent sacrificial gate structures 170 may be removed, and a portion of the first insulating layer IL1 formed on the side surface adjacent to the upper surface of the active structure may be removed together. As a result, the first side insulating layer 125 may be formed on a level higher than that of the upper surface of the first active region 105A, e.g., the first spacer layers 163 and the first side insulating layer 125 may be formed simultaneously, e.g., in a same process.

A portion of the active structure between the adjacent sacrificial gate structures 170 may be removed to form a recess region, and the first source/drain regions 150 may then be formed in the recess region. For example, a portion of the second to fourth sacrificial layers 112, 113, and 114, and the first to fourth channel layers 141, 142, 143, and 144 between the adjacent sacrificial gate structures 170 may be removed to form the recess region, and the first source/drain regions 150 may be formed in the resultant recess region. The first source/drain regions 150 may be formed on, e.g., to directly contact, side surfaces of the first to fourth channel layers 141, 142, 143, and 144, and on, e.g., to directly contact, the lowermost sacrificial layer 111 on a bottom surface of the recess region by a selective epitaxial growth process. The source/drain regions 150 may include silicon-germanium (SiGe), and p-type impurities, generated by in-situ doping, e.g., boron (B), indium (In), gallium (Ga), boron trifluoride ($BF_3$), or the like. Also, the first source/drain regions 150 may include a plurality of layers having different doping elements and/or different doping concentrations.

In an example embodiment, the first source/drain regions 150 may include a plurality of epitaxial layers, and an outermost epitaxial layer may have an impurity concentration of about 10 at % or less and a thickness of about 1 nm or more. For example, the outermost epitaxial layer may have an impurity concentration of about 1 at % or more to about 10 at % or less and a thickness of about 1 nm or more to about 50 nm or less. Since the outermost epitaxial layer has the impurity concentration and the thickness, only a sacrificial layer may be selectively removed without damage to the outermost layer of the first source/drain region 150 in a subsequent process of removing the sacrificial layer.

The passivation layer 126 may be formed on a side surface of the first source/drain region 150 that is not surrounded by the first side insulating layer 125, e.g., the passivation layer 126 may be formed on the side surface of the first source/drain region 150 above the first side insulating layer 125 relative to the substrate 101. For example, the passivation layer 126 may be formed by an epitaxial growth process.

Figure 7C:
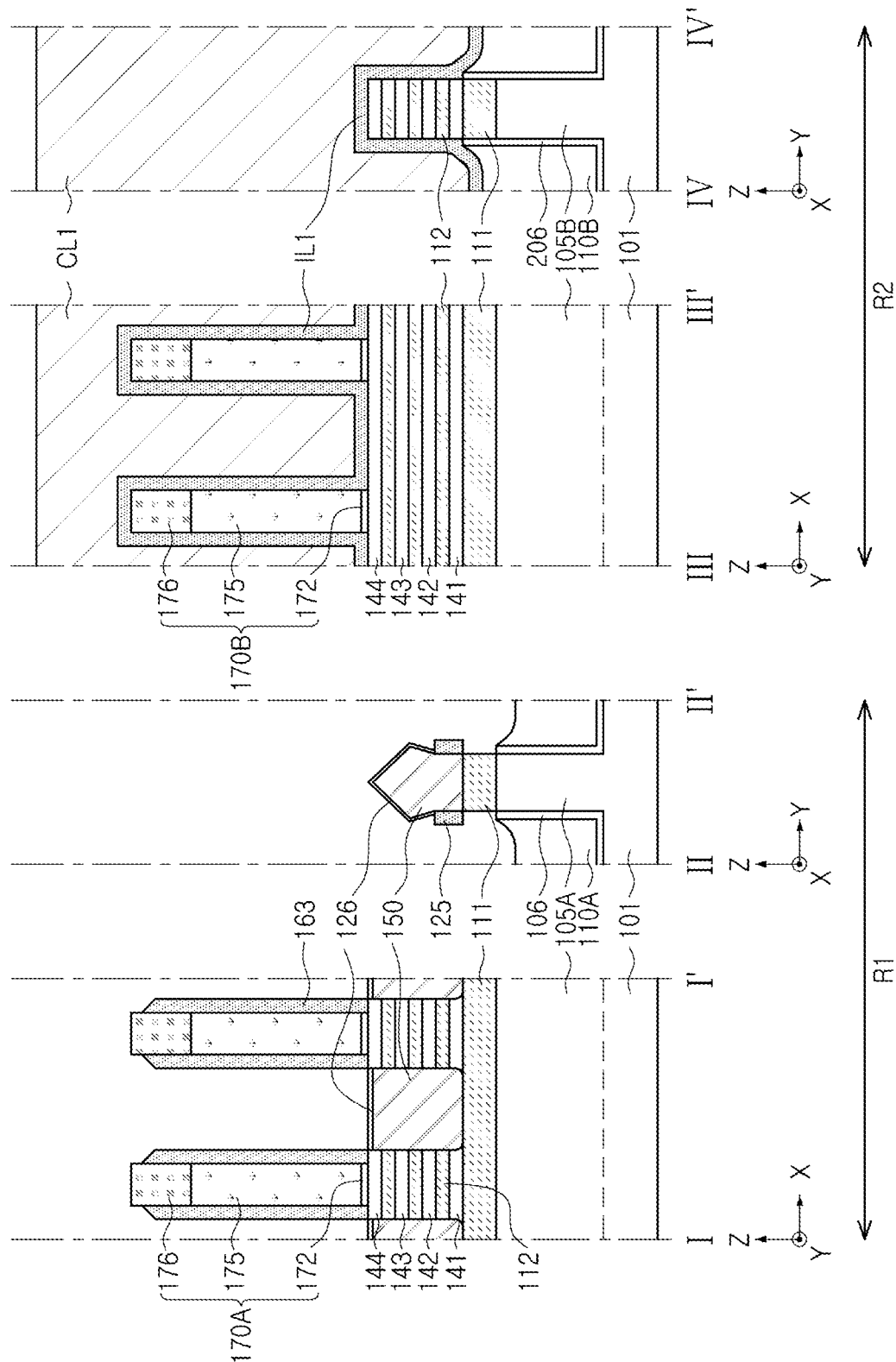

Referring to FIG. 7C, the device isolation layer 110 in the first region R1 may be etched, so that an upper surface of the device isolation layer 110 may be disposed on a level lower than a level of a lower surface of the lowermost sacrificial layer 111. In addition, the liner 106 formed on the side surface of the first active region 105A in the first region R1 may also be etched. As a result, the side surface of the lowermost sacrificial layer 111 may be exposed.

Figure 7D:
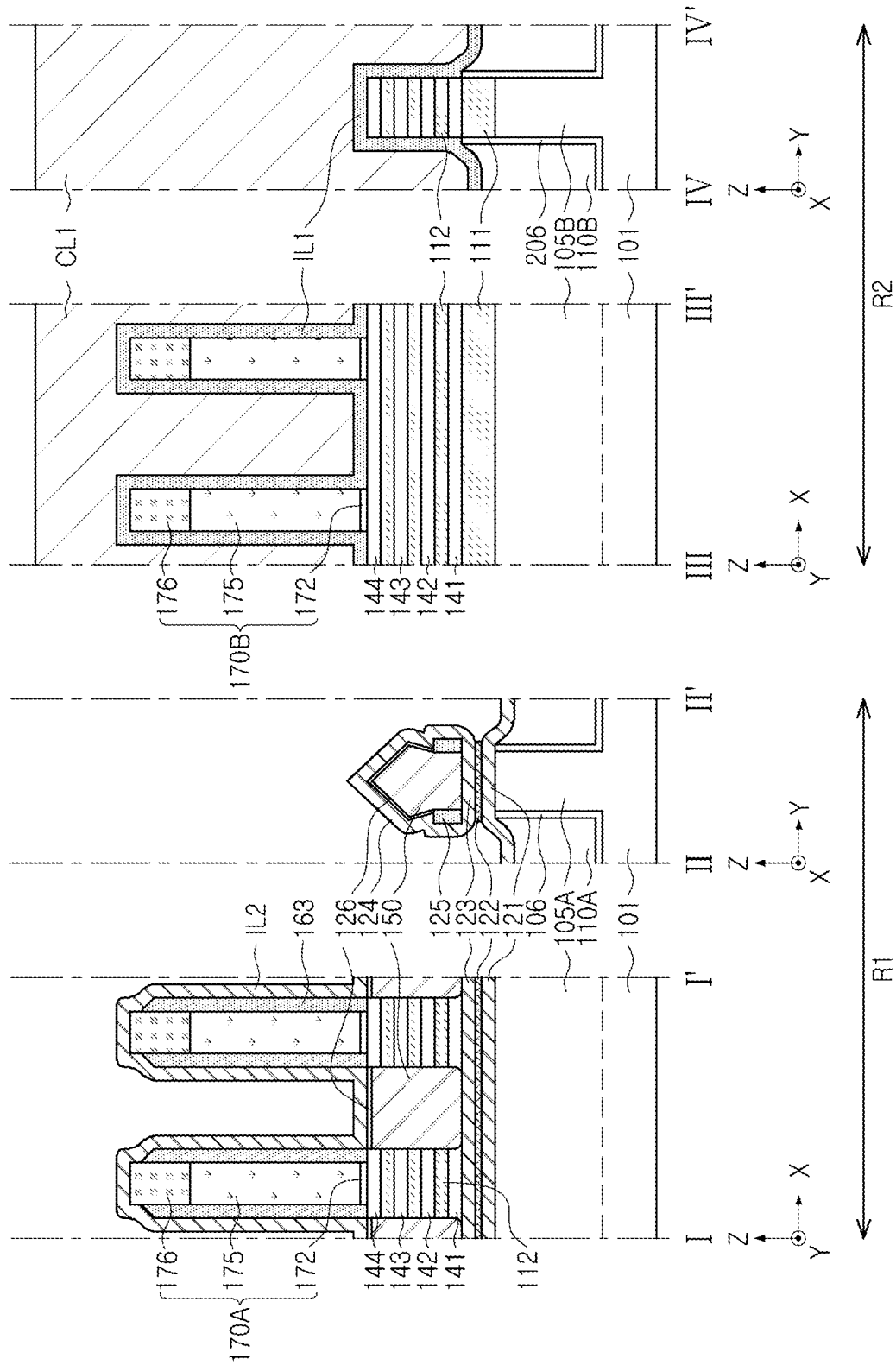

Referring to FIG. 7D, the lowermost sacrificial layer 111 may be removed in the first region R1, and a second insulating layer IL2 may be formed to conformally cover surfaces of the first source/drain region 150, the sacrificial gate structure 170, the first active region 105A, and the device isolation layer 110. In a space in which the lowermost sacrificial layer 111 is removed, the first lower insulating layer 121 may be formed on an upper surface of the first active region 105A to extend in a first direction, and the third lower insulating layer 123 may be formed on lower surfaces of the channel structure 140 and the first source/drain region 150 to extend in the first direction. For example, the second insulating layer IL2 and the first and third lower insulating layers 121 and 123 may be simultaneously formed. The first lower insulating layer 121 may extend to the device isolation layer 110 adjacent to the first active region 105A.

The second lower insulating layer 122 may be formed between the first and third lower insulating layers 121 and 123. In an example embodiment, an insulating layer including the same material as the second lower insulating layer may be conformally formed on the second insulating layer IL2 at the same time as the second lower insulating layer 122 is formed between the first and third lower insulating layers 121 and 123. The insulating layer formed on the second insulating layer IL2 may be removed in a subsequent process to form a structure, as illustrated in FIG. 7D.

The second lower insulating layer 122 may include a material different from a material of the first and third lower insulating layers 121 and 123, and may have a thickness different from a thickness of each of the first and third lower insulating layers 121 and 123. Thus, the first insulating structure including the first to third lower insulating layers 121, 122, and 123 may be formed. The third lower insulating layer 123 may extend upwardly of, e.g., along, the side surface of the first source/drain region 150.

Figure 7E:
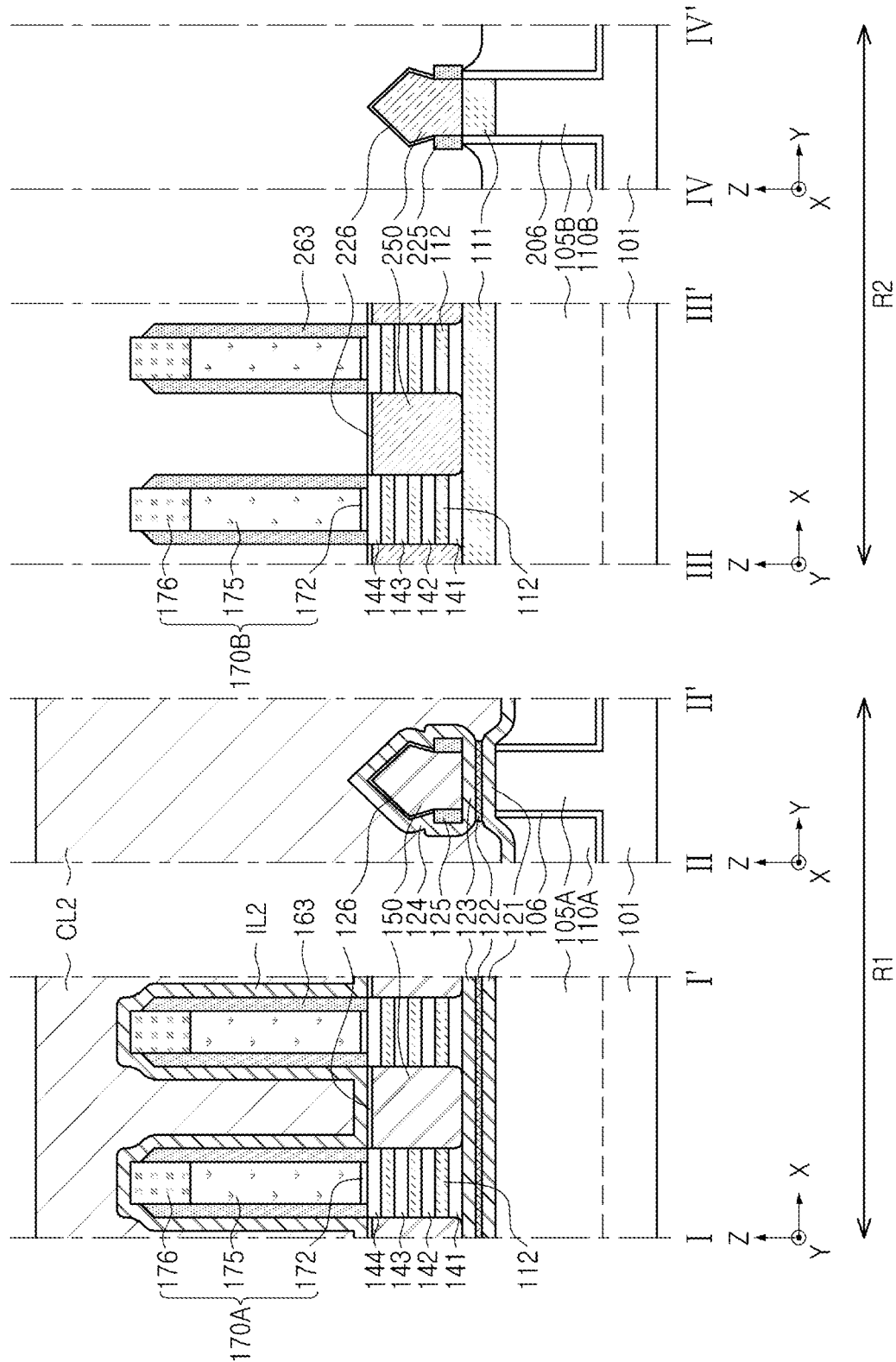

Referring to FIG. 7E, the first capping layer CL1 formed on the second region R2 of the substrate 101 may be removed, and the sacrificial gate structures 170 and the second capping layer CL2 may be formed on the first region R1 of the substrate 101 to cover the sacrificial gate structures 170 and the active structure. After the second capping layer CL2 is formed in the first region R1, a portion of the first insulating layer IL1 in the second region R2 may be etched to be removed. For example, the first insulating layer IL1 formed on the upper surfaces of the mask pattern layers 176 of the sacrificial gate structures 170 may be removed, and a portion of the first insulating layer IL1 formed on the side surface adjacent to the upper surface of the mask pattern layers 176 may be removed together. As a result, the third spacer layers 263 may be formed on the side surfaces of the sacrificial gate structures 170. In addition, the first insulating layer IL1 formed on the upper surface of the active structure between the adjacent sacrificial gate structures 170 may be removed, and the first insulating layer IL1 formed on the side surface adjacent to the upper surface of the active structure may be removed together. As a result, the second side insulating layer 225 may be formed on a level higher than a level of the upper surface of the second active region 105B.

A portion of the active structure between adjacent sacrificial gate structures 170 may be removed to form a recess region, and the second source/drain regions 250 may then be formed in the recess region. For example, the second source/drain regions 250 may be formed in the recess region formed by removing portions of the second to fourth sacrificial layers 112, 113, and 114 and the first to fourth channel layers 141, 142, 143, and 144 (as discussed previously with reference to the first source/drain regions 150 in FIG. 7D). The second source/drain regions 250 may be formed on side surfaces of the first to fourth channel layers 141, 142, 143, and 144, and on the lowermost sacrificial layer 111 on a bottom surface of the recess region by a selective epitaxial growth process. The second source/drain regions 250 may include silicon-germanium (SiGe) and n-type impurities, generated by in-situ doping, e.g., phosphorus (P), nitrogen (N), arsenic (As), antimony (Sb), or the like. In addition, the second source/drain regions 250 may include a plurality of layers having different doping elements and/or different doping concentrations.

The passivation layer 226 may be formed on a side surface of the second source/drain region 250 that is not surrounded by the second side insulating layer 225. For example, the passivation layer 226 may be formed by an epitaxial growth process.

Figure 7F:
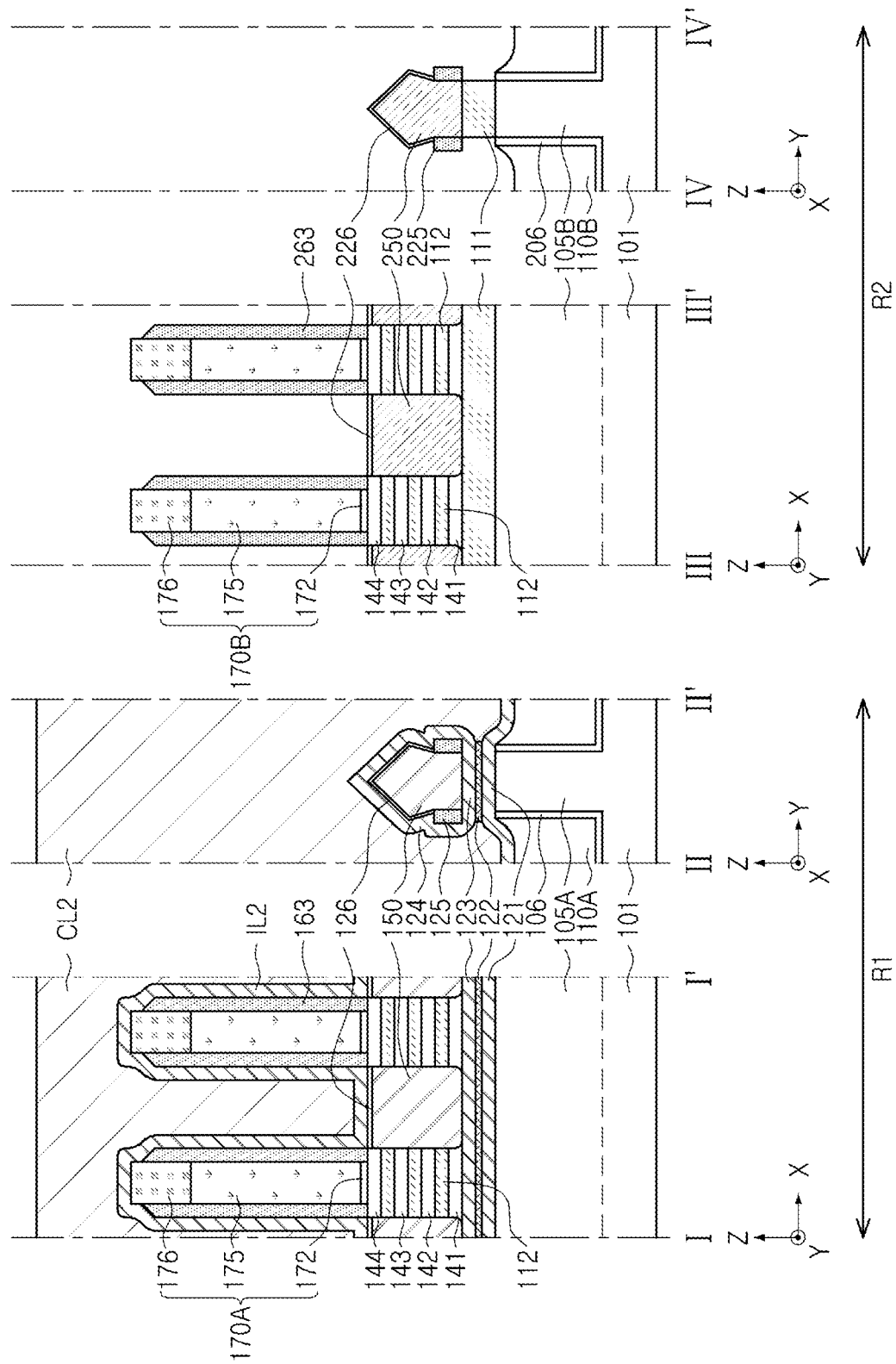

Referring to FIG. 7F, the device isolation layer 110 in the second region R2 may be etched, so that an upper surface of the isolation layer 110 may be disposed on a level lower than a level of a lower surface of the lowermost sacrificial layer 111. In addition, the liner 206 formed on the side surface of the second active region 105B in the second region R2 may also be etched. As a result, the surface of the lowermost sacrificial layer 111 may be exposed.

Figure 7G:
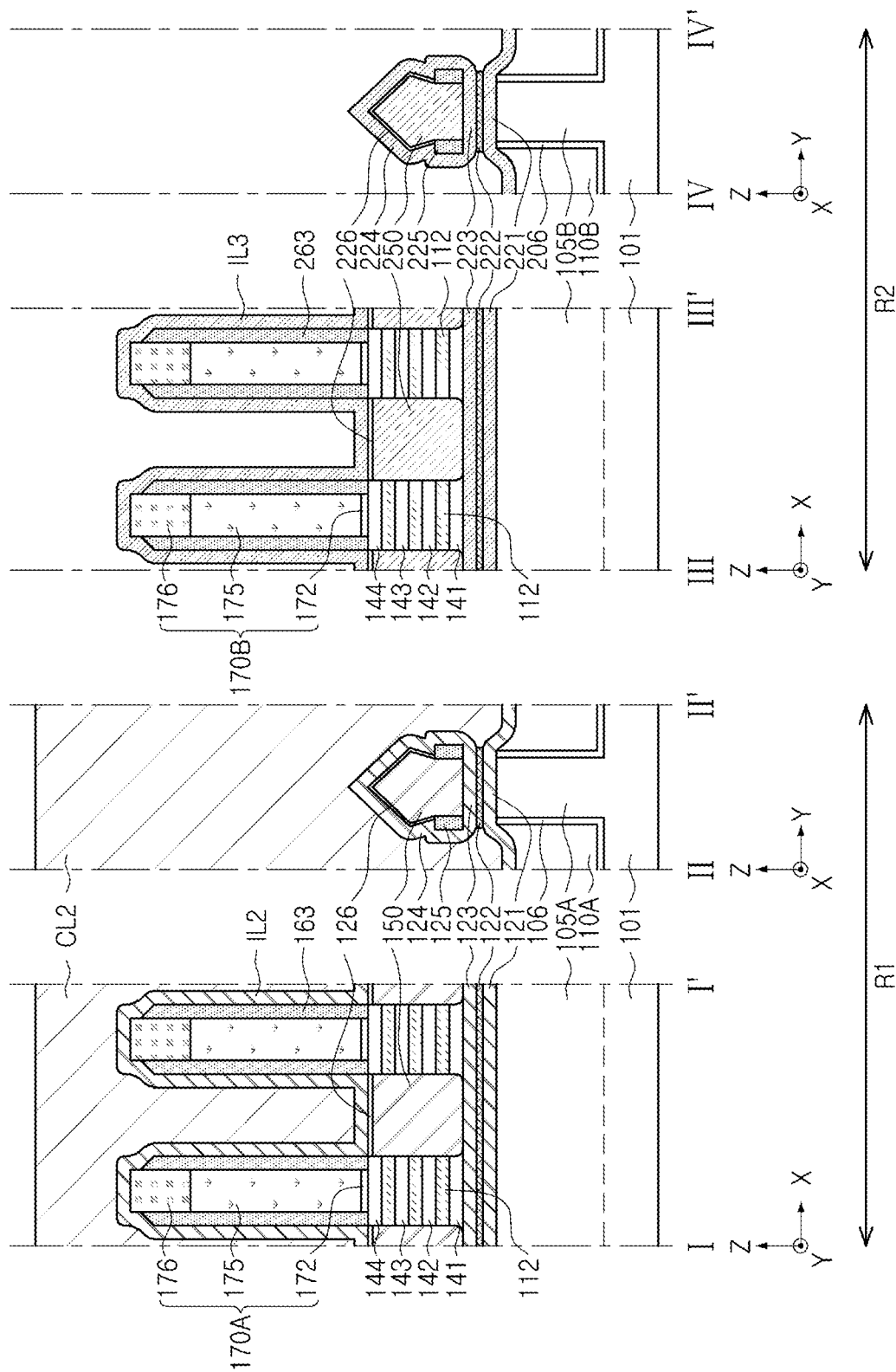

Referring to FIG. 7G, the lowermost sacrificial layer 111 may be removed in the second region R2, and a third insulating layer IL3 may be formed to conformally cover surfaces of the second source/drain region 150, the sacrificial gate structure 170, the second active region 105B, and the device isolation layer 110. In a space in which the lowermost sacrificial layer 111 is removed, the fourth lower insulating layer 221 may be formed on the upper surface of the second active region 105B to extend in the first direction, and the sixth lower insulating layer 223 may be formed on lower surfaces of the channel structure 240 and the second source/drain region 250 to extend in the first direction. For example, the third insulating layer IL3 and the fourth and sixth insulating lower layers 221 and 223 may be simultaneously formed. The fourth lower insulating layer 221 may extend to the device isolation layer 110.

The fifth lower insulating layer 222 may be formed between the fourth and sixth lower insulating layers 221 and 223. In an example embodiment, an insulating layer including the same material as the fifth lower insulating layer may be conformally formed on the third insulating layer IL3 at the same time as the fifth lower insulating layer 222 is formed between the fourth and sixth lower insulating layers 221 and 223. The insulating layer formed on the third insulating layer IL3 may be removed in a subsequent process to form a structure, as illustrated in FIG. 7G.

The fifth lower insulating layer 222 may include a material different from a material of the fourth and sixth lower insulating layers 221 and 223, and may have a thickness different from a thickness of each of the fourth and sixth lower insulating layers 221 and 223. Thus, a second insulating structure including the fourth to sixth lower insulating layers 221, 222, and 223 may be formed. In addition, the sixth lower insulating layer 223 may extend upwardly of a side surface of the second source/drain region 250.

Then, the capping layer CL2 formed on the first region R1 of the substrate 101 may be removed, the interlayer insulating layer 185 may be formed in the first region R1, and an interlayer insulating layer 285 may be formed in the second region R2. In addition, the sacrificial layers 112, 113, and 114 and the sacrificial gate structures 170 may be removed. The interlayer insulating layers 185 and 285 may be formed by forming an insulating layer to cover the sacrificial gate structures 170 and the first and second source/drain regions 150 and 250 and performing a planarization process.

In the first and second regions R1 and R2, the sacrificial layers 112, 113, and 114 and the sacrificial gate structures 170 may be selectively etched with respect to the first to fourth spacer layers 163, 164, 263, and 264, the interlayer insulating layers 185 and 285, and the channel layers 141, 142, 143, and 144. The sacrificial gate structures 170 may be removed to form upper gap regions, and the sacrificial layers 112, 113, and 114 exposed through the upper gap regions may then be removed to form lower gap regions. For example, when the sacrificial layers 112, 113, and 114 include silicon germanium (SiGe) and the channel layers 141, 142, 143, and 144 include silicon (Si), the sacrificial layers 112, 113, and 114 may be selectively removed by performing a wet etching process using peracetic acid as an etchant.

Next, referring to FIG. 2, the gate structures 160 and 260 may be formed in the upper gap regions and the lower gap regions in the first and second regions R1 and R2. The gate dielectric layers 162 may be formed to conformally cover internal surfaces of the upper gap regions and the lower gap regions. After the gate electrodes 165 are formed to completely fill the upper gap regions and the lower gap regions, the gate electrodes 165 may be removed from the upper portion to a predetermined depth in the upper gap regions. The gate capping layer 166 may be formed in a region in which the gate electrodes 165 are removed in the upper gap regions. Accordingly, the first gate structures 160 including the gate dielectric layer 162, the gate electrode 165, the first and second spacer layers 163 and 164, and the gate capping layer 166 may be formed in the first region R1, and the second gate structure 260 including the gate dielectric layer 262, the gate electrode 265, the third and fourth spacer layers 263 and 264, and the gate capping layer 266 may be formed in the second region R2.

Then, the first and second contact plugs 180 and 280 may be formed. The first and second contact plugs 180 and 280 may be formed by patterning the interlayer insulating layers 185 and 285 to form a contact hole and filling the contact hole with a conductive material. A lower surface of the contact hole may be recessed inwardly of the first and second source/drain regions 150 and 250, or may have a curve formed along the upper surfaces of the first and second source/drain regions 150 and 250. The shape and arrangement of the first and second contact plugs 180 and 280 may vary according to example embodiments.

By way of summation and review, example embodiments provide a semiconductor device having improved reliability. That is, as described above, an insulating structure for preventing leakage current may be included to provide a semiconductor device having improved reliability. The insulating structure includes an insulating material deposited on the source/drain regions after the source/drain regions are formed, so the insulating structure may be formed in all regions of an NMOS and a PMOS, and single-crystalline epitaxy may be achieved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate;
   a first active region and a second active region on the substrate, the first active region and the second active region each extending in a first horizontal direction along an upper surface of the substrate;
   device isolation layers on the upper surface of the substrate and on side surfaces of the first active region and the second active region;
   a first insulating structure and a second insulating structure on the first active region and the second active region, respectively, the first insulating structure and the second insulating structure covering at least a portion of upper surfaces of the device isolation layers;
   channel layers on each of the first insulating structure and the second insulating structure, the channel layers being vertically spaced apart from each other;
   a first gate structure on the channel layers and intersecting the first active region and a second gate structure on the channel layers and intersecting the second active region the first gate structure and the second gate structure each extending in a second horizontal direction and surrounding the channel layers;
   a first source/drain region doped with first conductivity-type impurities on the first insulating structure, the first source/drain region being on at least one side of the first gate structure and contacting the channel layers; and
   a second source/drain region doped with second conductivity-type impurities, different from the first conductivity-type impurities, on the second insulating structure, the second source/drain region being on at least one side of the second gate structure and contacting the channel layers,
   wherein at least a portion of the first insulating structure extends upwardly along an externally facing side surface in the second horizontal direction of the first source/drain region, and
   wherein at least a portion of the second insulating structure extends upwardly along an externally facing side surface in the second horizontal direction of the second source/drain region.

2. The semiconductor device as claimed in claim 1, wherein the first insulating structure includes a material different from a material of the second insulating structure.

3. The semiconductor device as claimed in claim 1, further comprising:
   a first side insulating layer between the side surface of the first source/drain region and the first insulating structure, the first side insulating layer extending upwardly along the side surface of the first source/drain region; and
   a second side insulating layer between the side surface of the second source/drain region and the second insulating structure, the second side insulating layer extending upwardly along the side surface of the second source/drain region.

4. The semiconductor device as claimed in claim 3, wherein:
   the first insulating structure includes a first lower insulating layer, a second lower insulating layer, and a third lower insulating layer sequentially stacked on the first active region; and
   the second insulating structure includes a fourth lower insulating layer, a fifth lower insulating layer, and a sixth lower insulating layer sequentially stacked on the second active region.

5. The semiconductor device as claimed in claim 4, wherein:
   the third lower insulating layer extends upwardly along the side surface of the first source/drain region; and
   the sixth lower insulating layer extends upwardly along the side surface of the second source/drain region.

6. The semiconductor device as claimed in claim 5, wherein:
   the first gate structure includes a first gate electrode layer, a first spacer layer on an external side of the first gate electrode layer, and a second spacer layer on an external side of the first spacer layer; and
   the second gate structure includes a second gate electrode layer, a third spacer layer on an external side of the second gate electrode layer, and a fourth spacer layer on an external side of the third spacer layer.

7. The semiconductor device as claimed in claim 6, wherein:
   the second spacer layer, the first lower insulating layer, and the third lower insulating layer include a same material; and
   the fourth spacer layer, the fourth lower insulating layer, and the sixth lower insulating layer include a same material.

8. The semiconductor device as claimed in claim 6, wherein the first spacer layer, the third spacer layer, the first side insulating layer, and the second side insulating layer include a same material.

9. The semiconductor device as claimed in claim 6, wherein:
   the first side insulating layer and the first spacer layer have substantially a same thickness; and
   the second side insulating layer and the third spacer layer have substantially a same thickness.

10. The semiconductor device as claimed in claim 4, wherein each of the second lower insulating layer and the fifth lower insulating layer includes at least one of SiN, SiO, SiCN, SiOC, SiON, SiOCN, and SiBCN.

11. The semiconductor device as claimed in claim 1, wherein a thickness of the first insulating structure and a thickness of the second insulating structure is greater than a distance of a gap between adjacent ones of the channel layers.

12. The semiconductor device as claimed in claim 1, wherein each of the first insulating structure and the second insulating structure includes a single layer.

13. The semiconductor device as claimed in claim 1, wherein:
   the first source/drain region includes silicon germanium (SiGe) and p-type impurities; and
   the second source/drain region includes silicon (Si) and n-type impurities.

14. The semiconductor device as claimed in claim 1, further comprising internal spacer layers between the channel layers on the second insulating structure, the internal spacer layers being on opposite sides of the second gate structure in the first horizontal direction.

15. A semiconductor device, comprising:
a substrate;
an active region on the substrate, the active region having a fin structure extending in a first direction on the substrate;
an insulating structure on the active region and extending in the first direction, wherein a lowermost surface of the insulating structure is located at a level below an uppermost surface of the fin structure;
channel layers on the insulating structure and vertically spaced apart from each other;
a gate structure intersecting the active region and the channel layers on the substrate, the gate structure extending in a second direction and surrounding the channel layers; and
a source/drain region on the insulating structure, the source/drain region being on at least one side of the gate structure and contacting the channel layers, and the insulating structure contacting a lower surface of the source/drain region and a lower surface of a lowermost of the channel layers,
wherein the insulating structure covers an entirety of the lower surface of the lowermost of the channel layers.

16. The semiconductor device as claimed in claim 15, wherein at least a portion of the insulating structure extends upwardly along at least one side surface of the source/drain region.

17. The semiconductor device as claimed in claim 15, wherein the insulating structure includes a first lower insulating layer, a second lower insulating layer, and a third lower insulating layer sequentially stacked on the active region, the first lower insulating layer, the second lower insulating layer, and the third lower insulating layer having a substantially same thickness.

18. The semiconductor device as claimed in claim 17, wherein:
the first lower insulating layer and the third lower insulating layer include a same material; and
the second lower insulating layer includes a material different from the material of the first and third lower insulating layers.

19. The semiconductor device as claimed in claim 17, wherein a sum of thicknesses of the first to third lower insulating layers is about 10 nanometers to about 100 nanometers.

20. A semiconductor device, comprising:
a substrate;
a first active region and a second active region on the substrate, the first active region and the second active region each extending in a first horizontal direction on the substrate;
first channel layers on the first active region and vertically spaced apart from each other;
second channel layers on the second active region and vertically spaced apart from each other;
a first source/drain region on the first active region and contacting the first channel layers;
a second source/drain region on the second active region and contacting the second channel layers;
a first gate structure intersecting the first active region and the first channel layers on the substrate, the first gate structure extending in a second horizontal direction that intersects the first horizontal direction;
a second gate structure intersecting the second active region and the second channel layers on the substrate, the second gate structure extending in the second horizontal direction;
a first insulating structure contacting an upper surface of the first active region and a lower surface of the first source/drain region, such that a first portion of the first insulating structure is disposed between the first active region and the first source/drain region; and
a second insulating structure contacting an upper surface of the second active region and a lower surface of the second source/drain region, such that a second portion of the second insulating structure is between the second active region and the second source/drain region,
wherein the first insulating structure including a material different from a material of the second insulating structure,
wherein an upper end of the first insulating structure is at a higher level than an upper end of the first source/drain region, and
wherein an upper end of the second insulating structure is at a higher level than an upper end of the second source/drain region.

* * * * *